United States Patent [19]
Nishimoto et al.

[11] Patent Number: 4,830,498
[45] Date of Patent: May 16, 1989

[54] POSITION DETECTING DEVICE

[75] Inventors: Yoshifumi Nishimoto, Yokohama; Masahiko Okunuki, Tokyo; Takao Kariya, Akigawa; Yasuo Kawai, Shizuoka; Akio Atsuta, Kawasaki, all of Japan

[73] Assignee: Canon Kabushiki Kaisha, Tokyo, Japan

[21] Appl. No.: 218,447

[22] Filed: Jul. 12, 1988

Related U.S. Application Data

[63] Continuation of Ser. No. 142,287, Dec. 31, 1987, abandoned, which is a continuation of Ser. No. 790,265, Oct. 22, 1985, abandoned.

[30] Foreign Application Priority Data

| Oct. 25, 1984 | [JP] | Japan | 59-224923 |
| Nov. 19, 1984 | [JP] | Japan | 59-242490 |
| Mar. 29, 1985 | [JP] | Japan | 60-65466 |
| Apr. 26, 1985 | [JP] | Japan | 60-90128 |

[51] Int. Cl.$^4$ .............................................. G01B 11/14
[52] U.S. Cl. ........................................ 356/400; 356/375
[58] Field of Search ................... 356/373, 375, 400; 350/379

[56] References Cited

U.S. PATENT DOCUMENTS

| 3,565,532 | 2/1971 | Heitmann et al. | 356/375 |
| 4,124,273 | 11/1978 | Huignard et al. | 350/379 |

FOREIGN PATENT DOCUMENTS

| 0057339 | 8/1982 | |
| 0091233 | 10/1983 | European Pat. Off. |
| 0116753 | 8/1984 | European Pat. Off. |
| 0171816 | 2/1986 | European Pat. Off. |
| 1613987 | 7/1971 | Fed. Rep. of Germany |
| 0208945 | 12/1983 | Japan |
| 2137841 | 10/1984 | United Kingdom |

OTHER PUBLICATIONS

Korth, "Laser Scanning Exposure System with Active Focus Control", IBM Tech. Disc. Bulletin, vol. 26, No. 9, Feb. 1984.
Japanese Publication "1983 Seiki Gakkai Autumn Conference Lecture Meeting Papers", pp. 391 and 392.

Primary Examiner—Eugene R. Laroche
Assistant Examiner—Robert J. Pascal
Attorney, Agent, or Firm—Fitzpatrick, Cella, Harper & Scinto

[57] ABSTRACT

A position detecting device for detecting the position of an object includes an illumination optical system for producing a light beam and for irradiating the object with the light beam, an optical system for focusing the light beam, a focus position controlling system operative to change the position at which the light beam is focused by the focusing optical system, a first detecting device for receiving the light beam reflected from the object to detect the state of incidence of the light beam on the object, and a second detecting device for detecting the position of the object on the basis of the detection of the state of incidence of the light beam on the object by the first detecting means.

17 Claims, 12 Drawing Sheets

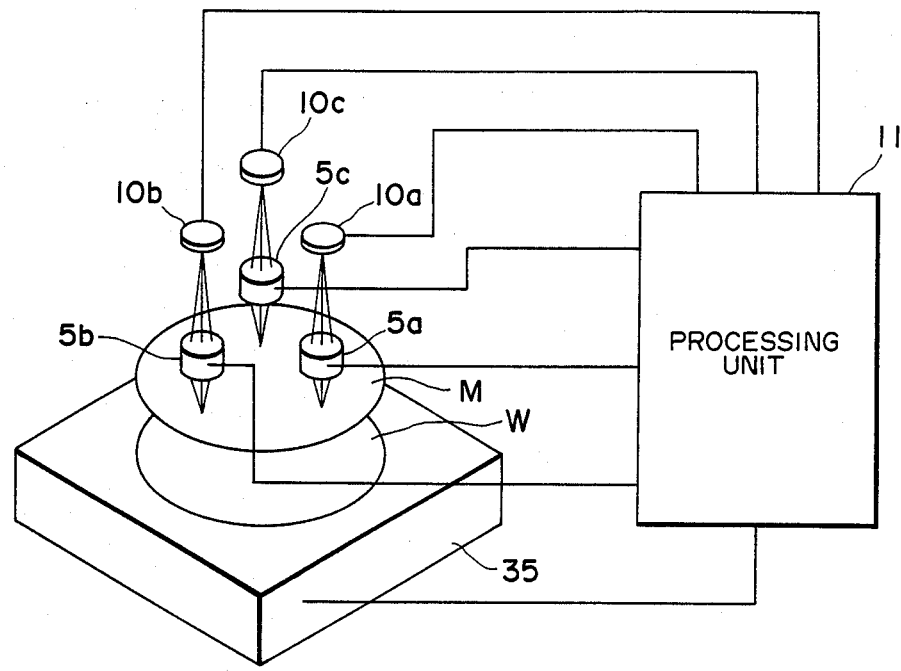
FIG. 18
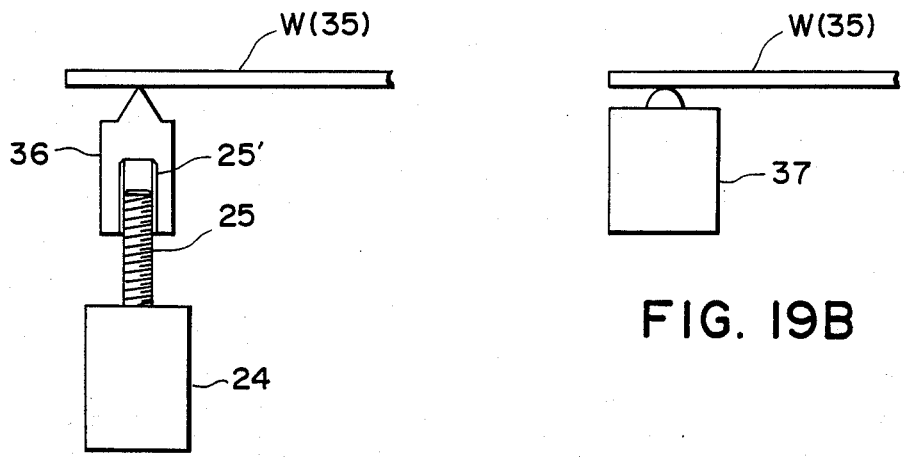
FIG. 19A
FIG. 19B

POSITION DETECTING DEVICE

This application is a continuation of application Ser. No. 142,287 filed 12/31/87, now abandoned, which was a continuation of application Ser. No. 790,265 filed 10/22/85, now abandoned.

FIELD OF THE INVENTION AND RELATED ART

This invention relates to a position detecting device and, more particularly, to a device for optically detecting the position of an object. In still another aspect, the invention is concerned with a distance detecting device for detecting the position of an object relative to a predetermined reference position to thereby detect the distance between the reference position and the object.

As for such position or distance detecting device, those into which focus detecting systems used in automatic focusing for optical memories are incorporated have been proposed. An example of such position or distance detecting device is arranged so that a detecting light beam is projected onto an object to be examined and, while detecting the state of focus of the detecting light beam relative to the object, an objective lens for irradiating the object with the detecting light beam is displaced until the detecting light beam is correctly focused on the object. From the amount of displacement of the objective lens, the position of the object relative to a predetermined reference position and thus the distance therebetween are detected. Such distance detecting system, however, requires a mechanical arrangement for displacing the objective lens, which leads to a complicated structure. Further, the necessity of displacement of the objective lens hinders reduction in time for the detection.

As another example, there has been proposed a critical-angle type position detecting device in which a spot-like light beam is projected on an object to be examined and the light reflected by the object is received by a two-division sensor having two discrete light-receiving areas. On the basis of the phenomenon that the outputs of these two light-receiving areas of the sensor vary in a substantially linear relation with change in the position of the object, the position of the object is detected by processing the outputs of the two-division sensor.

With such system, high-accuracy and high-speed detection are attainable However, the linearity between the focus signal and the position of the object, being examined, is assured only within a limited range. Therefore, the field of use of the detecting system is quite restricted.

SUMMARY OF THE INVENTION

It is accordingly a primary object of the present invention to provide a distance detecting device which assures high-accuracy and high-speed detection in an enlarged range of detection, with a simple structure.

It is another object of the present invention to provide a spacing detecting device for detecting the spacing between two objects with high accuracies and in a reduced time.

It is a further object of the present invention to provide a spacing adjusting device for adjusting the spacing between two objects with high accuracies and in a reduced time.

It is a still further object of the present invention to provide an alignment device which assures alignment between two objects three-dimensionally.

Briefly, according to the present invention, there is provided a position detecting device for detecting the position of an object, the device comprising means for producing a light beam and for irradiating the object with the light beam, means for focusing the light beam produced by the producing means, focus position controlling means operative to change the position at which the light beam is focused by the focusing means, first detecting means for receiving the light beam reflected from the object to detect the state of incidence of the light beam on the object, and second detecting means for detecting the position of the object on the basis of the detection of the state of incidence of the light beam on the object by the first detecting means.

These and other objects, features and advantages of the present invention will become more apparent upon a consideration of the following description of the preferred embodimens of the present invention taken in conjunction with the accompanying drawings.

BRIEF DESCRIPTION OF THE DRAWINGS

FIG. 18 is a schematic and diagrammatic view of a spacing adjusting device according to a further embodiment of the present invention.

FIGS. 19A and 19B are schematic views, respectively, showing spacing adjusting mechanisms usable in the spacing adjusting device of FIG. 18, respectively.

DESCRIPTION OF THE PREFERRED EMBODIMENTS

Figure 1:
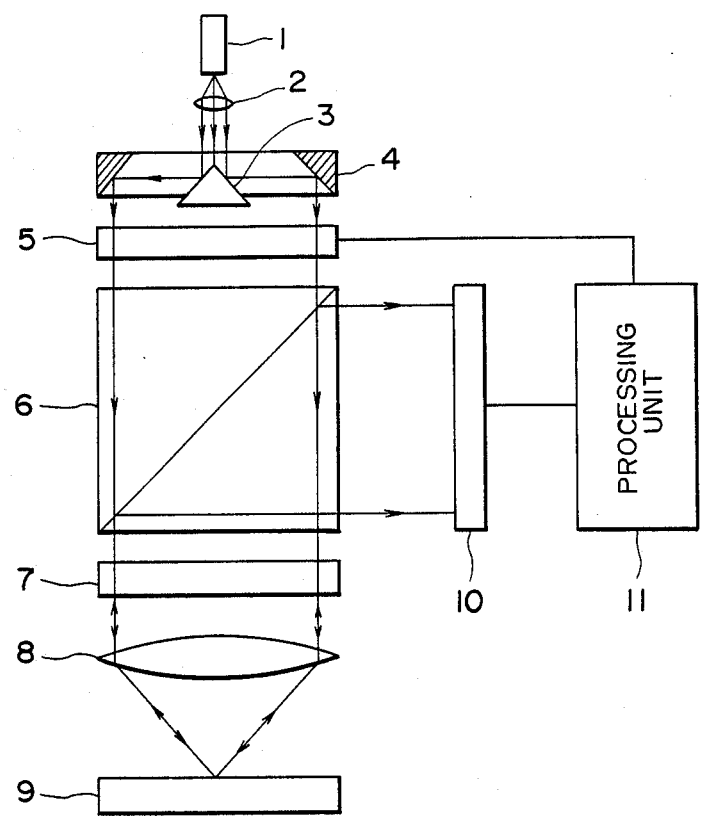
FIG. 1 is a schematic and diagrammatic view of a distance detecting device according to an embodiment of the present invention.

Referring first to FIG. 1, there is shown a position detecting device according to an embodiment of the present invention.

As shown in FIG. 1, the position detecting device includes a laser source 1 for producing a laser beam; a collimator lens 2 for collimating the laser beam emitted from the laser source 1; a first conical mirror 3 having an outer conical reflection surface; a second conical mirror 4 having an internal conical reflection surface; focus position controlling means 5; a polarization beam splitter 6; a quarter waveplate 7; a condensing lens 8 for converging or focusing the laser beam passed through the quarter waveplate 7 and directing the convergent laser beam to an object 9 to be examined; focus state detecting means 10; and a processing unit 11. More particularly, the laser beam emitted from the laser source 1 is collimated by the collimator lens 2. The collimated laser beam is incident on an apex of the first conical mirror 3, so that it is reflected to all radial directions in a plane perpendicular to the optical axis defined by the collimator lens 2 and the laser source 1. These horizontally advancing rays reflected from the first conical mirror 3 are reflected downwardly by the internal reflection surface of the second conical mirror 4, whereby a ring-like or annular laser beam (flux) having a doughnut or annular shape in cross-section is defined. That is, the central portion of the annular laser beam is vacant. The annular laser beam passes through the focus position controlling system 5, the polarization beam splitter 6, the quarter waveplate 7 and the condensing lens 8 so that it is incident on the object 9. The laser beam incident on the object 9 is reflected by the surface of the object 9, so that it enters again into the condensing lens 8, the quarter waveplate 7 and the polarization beam splitter 6.

When the laser beam emitted from the laser source 1 and transmitted through the polarization beam splitter 6 passes through the quarter waveplate 7, the quarter waveplate 7 serves to convert the linearly polarized beam into a circularly polarized beam. When, on the other hand, the circularly polarized beam reflected back from the surface of the object 9 is incident on the quarter waveplate 7, the quarter waveplate 7 serves to convert the circularly polarized beam into a linearly polarized beam having a direction of polarization orthogonal to that of the first-mentioned linearly polarized beam. As a result, the laser beam reflected from the surface of the object 9 is reflected by the polarization beam splitter 6 to the focus state detecting means 10.

For the best understanding of the present invention, with respect to the focus position controlling means 5, reference may be made to U.S. patent application, Ser. No. 359,034 filed Mar. 17, 1983, corresponding to Japanese Laid-Open Patent Application, Laid-Open No. 157213/1982; U.S. patent application, Ser. No. 453,161 filed Dec. 27, 1982, corresponding to Japanese Laid-Open Patent Application, Laid-Open No. 118618/1983; and Japanese Patent Application No. 119180/1983.

As an example of the focus position controlling means 5 in the present embodiment, a variable focal-length lens (which hereinafter "varifocal lens") disclosed in the above-mentioned Japanese Patent Application No. 119180/1983, will now be described.

Figure 2:
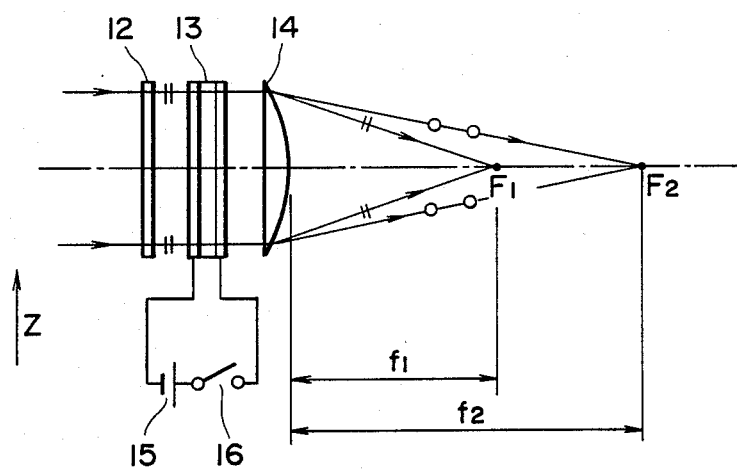
FIG. 2 is a schematic view showing the principle of focus position control by focus position controlling means employed in the distance detecting device of FIG. 1.

The varifocal lens disclosed in this patent application includes a lens element made of a solid material showing an optically anisotropy and means for changing the direction of polarization of light to be incident on the lens element. FIG. 2 shows such varifocal lens system. Denoted in this Figure by reference numeral 12 is a polarizing plate; by 13, a polarization plane rotating element; by 14, a double refraction lens; by 15, a voltage source; and by 16, a switch. The polarization plane rotating element 13 is adapted to rotate the plane of polarization of the light being transmitted, in response to application of an electric field. For example, the polarization plane rotating element 13 comprises a "Z-axis cut plate" of $KH_2PO_4$ single crystal having transparent electrodes formed on it both sides.

The double refraction lens 14 is so formed that the optic axis of the crystal (which hereinafter "Z-axis") intersects the principal axis of the lens element orthogonally. And, the double refraction lens element 14 is disposed so that the Z-axis extends in parallel to the plane of the sheet of the drawing. With this arrangement, the double refraction lens element 14 shows a refractive index $n_o$ for ordinary rays, which is a refractive index with respect to the direction of polarization that is perpendicular to the principal axis of the lens element and is parallel to the plane of the sheet of the drawing, and another refractive index $n_e$ for extraordinary rays, which is a refractive index with respect to the direction of polarization that is perpendicular to the principal axis of the lens element and is also perpendicular to the plane of the sheet of the drawing.

When, in the FIG. 2 arrangement, the switch 16 is open, the linearly polarized light provided by the polarizing plate 12 enters into the double refraction lens element 14 without it direction of polarization being changed, so that the light passing through the double refraction lens element 14 is subjected to or experiences the refractive index $n_o$, whereby it is focused at a position F1 located at a first focal length f1. At this time, the direction of polarization of the light passed through the double refraction lens element 14 is the same as that of the light when entered into the polarization plane rotating element 13, namely, is parallel to the plane of the sheet of the drawing. When, on the other hand, the switch 15 is closed, the direction of polarization of the light entering into the polarization plane rotating element 13 is rotated by the action of the polarization plane rotating element 13 by an angle of 90 degrees, so that the direction of polarization is now perpendicular to the plane of the sheet of the drawing. As a result, the light emerging from the double refraction lens element 14 is focused at a position F2 which is located at a second focal length f2 determined by the refractive index $n_e$.

In this manner, two kinds of focal lengths f1 and f2 are obtainable with a combination of a polarization plane rotating element such as at 13 and are double refraction lens element such as at 14. The focus position controlling means 5 of the FIG. 1 embodiment includes N sets or pairs of polarization plane rotating elements and double refraction lens element, wherein N is an integral number greater than 1. These pairs, each comprising the combination of one polarization plane rotating element and one double-refraction lens element such as shown in FIG. 2, are disposed along the optical axis, so that focal distances of number $2^N$ and therefore focal points of number $2^N$ can be defined along the optical axis, by selectively energizing the polarization plane rotating elements. This allows that the laser beam is focused at a selected one of different points, of number $2^N$, on the optical axis.

As for the focus position controlling means 5, an electro-optic element, such as disclosed in the above-mentioned U.S. patent application Ser. No. 359,034, which element is adapted to deflect a light beam in response to application of an electric field, or a liquid crystal device operable in a similar manner may be used in place of the above-described combined polarization plane rotating element and double refraction lens element. Use of such electrooptic element is preferable because it allows infinite (not stepwise) adjustment of the focus position.

While the focus position controlling means 5 has been described and illustrated as being located between the conical mirror 4 and the polarization beam splitter 6, this is not limitative. For example, it may be disposed between the polarizing plate 7 and the condensing lens 8. In such case, the condensing lens 8 may be replaced by one of the double refraction lens elements used as the components of the focus position controlling means Referring now to FIGS. 1 and 3-5, the focus state detecting means 10 for detecting the state of focus of the laser beam on the object 9, i.e., the state of incidence of the laser beam on the object 9, will now be described in detail.

Figure 3:
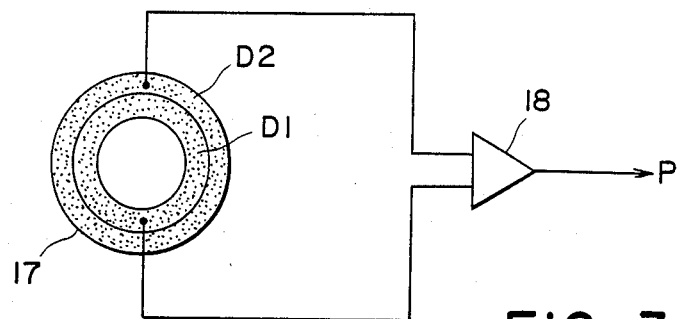
FIG. 3 is a schematic view showing an example of focus state detecting means employed in the distance detecting device of FIG. 1.

FIG. 3 shows an example of the focus state detecting means 10 which is particularly adapted to be used with the detection laser beam of annular shape in cross-section, such as the laser beam defined by the FIG. 1 arrangement. As shown in FIG. 3, the focus state detecting means 10 comprises an annular sensor 17 which is provided by concentrically disposed inner and outer annular photoelectric converting elements D1 and D2. Each of these inner and outer photoelectric converting elements D1 and D2 is connected to a differential amplifier 18, so that outputs of the inner and outer photoelectric converting elements D1 and D2 are compared with each other to produce a focus signal P corresponding to the difference therebetween and representing the state of focus of the laser beam on the surface of the object 9.

More specifically, the annular sensor 17 is so disposed that, when the annular laser beam defined by the combination of the conical mirrors 3 and 4 is correctly focused on the surface of the object 9 (see FIG. 1), the annular laser beam reflected by the surface of the object 9 and reflected by the polarization beam splitter 6 is incident on the annular sensor 17 at a region thereof across the circular boundary between the inner and outer photoelectric converting elements D1 and D2. Preferably, in such case, the annular laser beam is incident on a portion of the inner photoelectric converting element D1 which borders the circular boundary and a portion of the outer photoelectric converting element D2 which borders the same circular boundary, these portions having substantially the same area. Therefore the outputs of the inner and outer photoelectric converting elements D1 and D2 become substantially equal to each other, such that a "zero output" is produced by the differential amplifier 18 as the focus signal P. In other words, the generation of the focus signal P of "zero output" indicates that the surface of the object 9 is located exactly at the position of the focus of the annular laser beam defined by the distance detecting system at that time. If, on the other hand, the annular laser beam converged by the condensing lens 8 is focused at a position above the object 9 as viewed in FIG. 1, the diameter of the annular laser beam reflected from the object 9 surface and incident on the condensing lens 8 is enlarged as compared with that of the annular laser beam when it emerged from the condensing lens 8 toward the object 9. Therefore, the annular laser beam emitted from the condensing lens 8 back to the polarization beam splitter 6 becomes slightly convergent so that an annular laser beam having a reduced diameter is incident on the annular sensor 17. As a result, the output of the inner photoelectric converting element D1 increases, whereas the output of the outer photoelectric converting element D2 is reduced. If, to the contrary, the annular laser beam directed to the object 9 is one to be focused at a position below the object 9 surface as viewed in FIG. 1, the diameter of the annular laser beam reflected from the object 9 surface and incident on the condensing lens 8 is decreased as compared with that of the annular laser beam which emerged therefrom toward the object 9. As a result, the annular laser beam emitted from the condensing lens 8 back to the polarization beam splitter 6 becomes slightly diversive, so that an annular laser beam having an enlarged diameter is incident on the annular sensor 17. Therefore, the output of the outer photoelectric converting element D2 is increased, whereas the output of the inner photoelectric converting element D1 is decreased. In this manner, the diameter of the annular laser beam incident on the annular sensor 17 changes in proportion to the changes in the position of the surface of the object 9 with respect to the position of focus of the annular laser beam directed to the object 9, as long as the surface of the object 9 is located within a certain range. In other words, the output of the differential amplifier 18 changes in proportion to the change in the position of the surface of the object 9 if it is within the certain range. The relation between the position of the object 9 and the output of the differential amplifier 18 as described above is illustrated in FIG. 4. It is clear also from FIG. 4 that, by examining the output of the differential amplifier 18, i.e. the focus signal P, the position of the object 9 and thus the distance to the object 9 surface from a predetermined reference position can be detected. The linear portion in the graph of FIG. 4 corresponds to the range in which the detection is attainable.

On the basis of the above-described principle of detection, the position detecting device according to this embodiment of the present invention assures detection of the position of the object in a significantly enlarged range of detection. This will be described in more detail with reference to FIG. 5.

Figure 5:
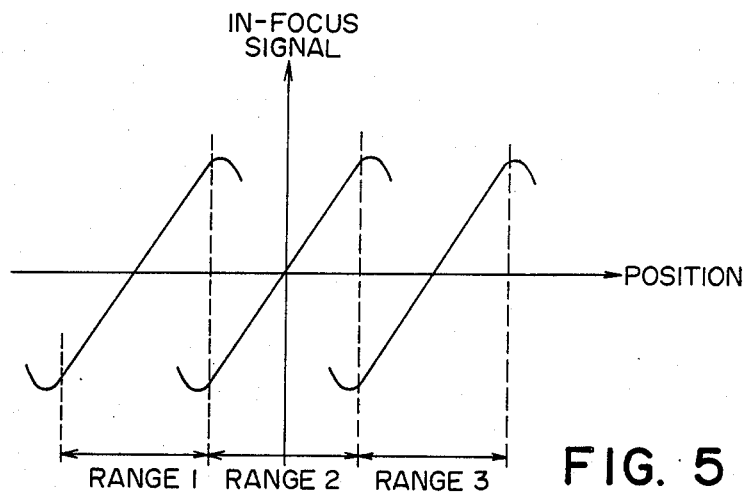
FIG. 5 is a graph showing detectable ranges defined by changing the focus position by focus position controlling means according to an embodiment of the present invention.

According to this embodiment of the present invention, the detectable range is enlarged by sequentially changing the position of focus of the annular laser beam, directed to the object 9, by the focus position controlling means 5 in the manner described hereinbefore. More particularly, by sequentially changing the focus position of the annular laser beam directed to the object to be examined, plural detectable ranges, such as, e.g., ranges 1–3 shown in FIG. 5, are defined. Preferably, the components of the focus position controlling means 5 are arranged so that adjacent limits of two adjacent ranges coincide with each other or that such two adjacent ranges partially overlap upon one another, to thereby define one continuous detectable range. Of course, adjacent ones of the plural detectable ranges may be slightly spaced from each other. In any case, the detectable range is significantly enlarged as compared with the case where the focus position of the detection laser beam is fixed. In addition, while in usual the detection sensitivity is contradictory to the extent of the range of detection, a high detection sensitivity can be still maintained, according to the present invention, irrespective of enlargement of the range of detection.

Use of the annular laser beam for the sake of position detection is preferable in the point that it suppresses the effect of various aberrations because only a small part of the condensing lens is used. However, this is not limitative and, for example, a spot-like beam is usable to detect the position of the object. In such case, the annular sensor 17 shown in FIG. 3 may be replaced by a circular sensor provided by an inner circular photoelectric converting element and an outer ring-like photoelectric converting element. Also, as for the focus state detecting means 10, a known type area sensor comprising arrays of charge-coupled devices (CCDs) or other image pickup devices may be used.

Figure 6:
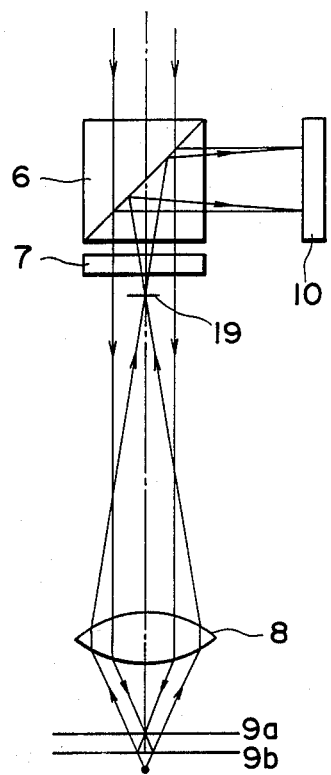
FIG. 6 is a schematic view showing a major part of a position detecting device according to another embodiment of the present invention.

Referring now to FIG. 6, a distance detecting device according to another embodiment of the present invention will be described.

The present embodiment is a slight modification of the FIG. 1 embodiment and includes, while not shown in FIG. 6, a laser source, a collimator lens, first and second conical mirrors and focus position controlling means all of which have substantially the same functions as of corresponding ones of the elements of the FIG. 1 embodiment. Also, the device of the present embodiment includes a polarization beam splitter 6, a polarizing plate 7, a condensing lens 8, focus state detecting means 10 and an unshown processing unit, also all of which have similar functions as of corresponding ones of the elements of the first embodiment. The distinctive feature of the present embodiment over the FIG. 1 embodiment lies in the provision of a light-blocking member 19 disposed on the optical path.

When the surface of the object to be examined is at a position denoted by numeral 9a in FIG. 6 and if the annular laser beam is exactly focused on the surface of the object at that position, the annular laser beam reflected by the surface of the object is incident on a predetermined area of the focus state detecting means 10, as described in the foregoing. If, on the other hand, the surface of the object is slightly deviated downwardly from the position denoted by numeral 9a in FIG. 6, the laser beam reflected by the surface of the object and passed through the condensing lens 8 is slightly converged. Thus, the position of incidence of the laser beam on the photodetector 10 is displaced and, therefore, the magnitude of the focus signal changes accordingly.

If, however, the surface of the object is located at a position (such as at 9b in FIG. 6) which is far remote from the focus position of the laser beam, in the direction away from the condensing lens 8, the laser beam reflected by the surface of the object and passed through the condensing lens 8 is significantly converted. In such case, depending on the location of the object, it is possible that the laser beam is once focused at a certain position on the optical path between the condensing lens 8 and the photodetector 10 and thereafter is diverged and that such divergent laser beam is incident on the region of the detection surface of the photodetector 10 which region is the same as the above-described predetermined area on which the laser beam correctly focused on the surface of the object and reflected therefrom would be incident. In other words, despite that the object is positioned outside the detectable range of the position detecting device defined at a particular time during the position detecting operation, it is possible in some cases that the detection laser beam which is once focused at a position between the condensing lens 8 and the object 9 and far remote from the surface of the object and which is then reflected by the surface of the object is incident, after being converged at a point, on such area of the focus state detecting means 10 that is the same as the predetermined area thereof on which the laser beam reflected from the surface of the object would be incident if the laser beam has been correctly focused on the surface of the object.

Figure 7:
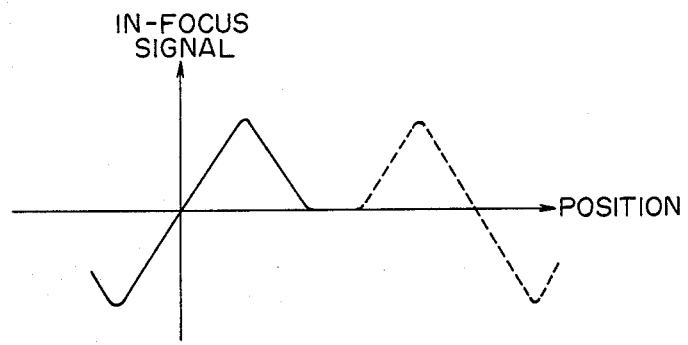
FIG. 7 is a graph for illustrating an advantageous effect of the device of FIG. 6.

If this occurs, then a false signal would be produced by the focus state detecting means 10. This is unpreferable. Such unpreferable false signal is shown in FIG. 7 by a broken line. In this Figure, a solid line shows the focus signal obtainable from the focus state detecting means 10 in a case where the object is located within the detectable range defined at a particular time during the position detecting operation. The origin of the co-ordinates corresponding to the "zero output" of the focus state detecting means 10 represents that the detection laser beam is exactly focused on the surface of the object being examined. The leftward direction along the axis of abscissa corresponds to the positional deviation of the object to be examined in a direction away from the condensing lens 8. It is seen from FIG. 7 that a series of focus signals, which are in fact false signals, as denoted by the broken line will be produced despite that the object is located outside the detectable range defined at that time during the position detecting operation.

In view of this, the light-blocking member 19 is provided at a position which is substantially on the optical axis and which is effective to intercept the above-described convergent laser beam bearing false positional information. Since the point of convergence of such laser beam can be roughly estimated according to the actual specifications of the optical system, the light-blocking member 19 is preferably positioned in proximity to the point of convergence. By this, the rays advancing in the vicinity of the optical axis are effectively intercepted and, therefore, the false signal shown by the broken line in FIG. 7 is obviated. Of course, the size and position of the light-blocking member are determined so as not to interfere with the path of the effective detection laser beam directed to the object from the polarization beam splitter and reflected back from the object.

The principle of position detection according to the position detecting device of the FIG. 1 embodiment will now be described in more detail with reference to FIG. 8. Numerals in this Figure like those in FIG. 1 denote corresponding elements. Denoted in this Figure by numerals 20 - 20 are annular beams formed by the condensing lens 8, corresponding to focus positions P1-P3 sequentially defined by the focus position controlling means 5 (FIG. 1). Also, references A1-A3 denote, respectively, detectable ranges corresponding to the focus positions P1-P3, respectively.

As has been described with reference to FIGS. 4 and 5, a satisfactorily linear relation is assured between the position of the object to be examined and the focus signal, in each of the detectable ranges A1-A3. Accordingly, by sequentially changing the focus position by the focus position controlling means 5 (FIG. 1), such as in an order from the focus position P1 to the focus position P3, thereby to sequentially define the detectable ranges such as in an order from the range A1 to the range A3, an optimum focus position having an optimum detectable range most suitable for detecting the position of the object 9 can be discriminated.

Where the outputs of the inner and outer photoelectric converting elements D1 and D2 shown in FIG. 3 are represented by "D1" and "D2", respectively, the focus signal F obtainable from the differential amplifier 18 can be expressed as "F" which is obtained by standardizing the differential signal "D2−D1" by the in-density signal "D2+D1", i.e.:

$$F = (D2 - D1)/(D2 + D1) \qquad (1)$$

Figure 8:
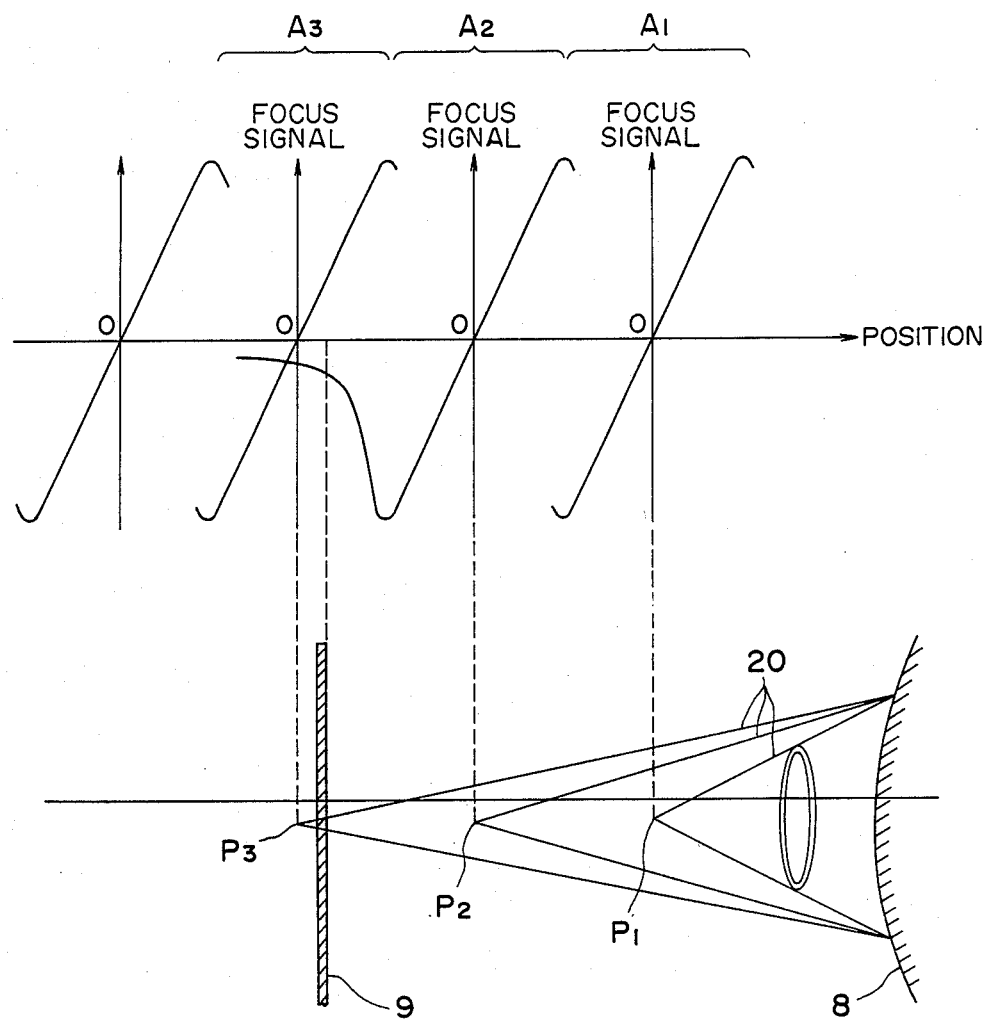
FIG. 8 is a schematic view showing an example of the manner of automatic distance detection, according to an embodiment of the present invention.

If the focus position of the annular laser beam is changed in an order from the position P1 to the position P3 as shown in FIG. 8, the annular laser beam 20 reflected by the surface of the object 9 has an expanded diameter when it is incident on the surface of the condensing lens 8, as long as the focus position is between the condensing lens 8 and the object 9, such as the focus positions P1 and P2. Consequently, the annular laser beam incident on the condensing lens 8 is slightly converged by the action of the condensing lens 8, so that an annular laser beam having a reduced diameter, as compared wit that which would be defined when the focus position P1 or P2 is coincident with the position of the object 9, is incident on the photoelectric converting element D1 and D2 (which hereinafter "ring sensors"). As a result, from equation (1), the value of the focus signal F is smaller than zero, i.e. F<0.

If, on the other hand, the focus position defined at a particular time during the position detecting operation is located at a side of the object 9 remote from the condensing lens 8, such as the focus position P3, the annular laser beam reflected from the surface of the object 9 has a reduced diameter when it is incident on the surface of the condensing lens 8. Consequently, the annular laser beam is slightly diverged by the action of the condensing lens 8, so that an annular laser beam having an expanded diameter, as compared with that which would be defined when the focus position P3 is coincident with the position of the object 9, is incident on the inner and outer ring sensors D1 and D2. As a result, from equation (1), the focus signal F becomes greater than zero, i.e. F>0.

It is seen from the above that the polarity (positiveness or negativeness) of the focus signal F changes when the focus position of the laser beam is displaced from a position (such as P2) which is located at a side of the object 9 facing the condensing lens and which is closest to object 9 to another position (such as P3) which is located at a side of the object 9 remote from the condensing lens 8 and which is closest to the object 9. Thus, by sequentially changing the focus position of the annular laser beam 20 and by discriminating the polarity of the focus signal F, these two positions can be detected. At least one of these two positions is the optimum focus position which defines an optimum detection range most suitable for detecting the position of the object 9.

While, in the above-described example, the focus position is changed in an order from the condensing lens 8 to the object 9, this may be reversed. Preferably, the focus position controlling means is arranged to define such focus positions that are effective to establish one continuous detection range in which adjacent limits of two adjacent segmental detection ranges are coincident with each other to assure the continuity. Of course, two adjacent segmental detection ranges may overlap upon one another. While, in the foregoing example, a standardized value F is used as the focus signal, the differential signal "D2−D1" may be used a the focus signal. Also, as for the differential signal, the value of "D1−D2" may be used. Where "D1−D2" is used as the differential signal, the linear relation between the position of the object to be examined and focus signal as shown in FIG. 4 is reversed (as can be represented by a line extending from 4:30 to 10:30 o'clock) and also the change of the polarity of the focus signal across the object to be examined is reversed.

The position detecting operation according to the above-described principle will now be described in more detail with reference to a flow chart of FIG. 9.

It is now assumed that the focus position controlling means 5 of the FIG. 1 embodiment is adapted to establish one focus position per unit distance N and that the inner and outer ring sensors D1 and D2 produce outputs "D′1" and "D′2", respectively, when the focus position of the laser beam is at a point which is located at a side of the object 9 facing the condensing lens 8 and which is closest to the object 9. Whereas the inner and outer ring sensors D1 and D2 produce outputs "D1" and "D2", respectively, when the focus position of the laser beam is at a position which is located at a side of the object 9 remote from the condensing lens 8 and which is closest to the object 9. The focus signal F is defined in a similar manner by equation (1), that is:

$$F = (D2 - D1)/(D2 + D1)$$

First, at Step 101, the annular laser beam is focused at a position closest to the condensing lens 8, i.e. the position corresponding to the shortest focal length, and then, the detection of the focus signal F is initiated (Step 102). Subsequently, whether or not F<0 is discriminated at Step 103. If F<0, the sequence proceeds to Step 104. At Step 104, the focus position controlling means 5 is operated to change the focus position, so that the annular laser beam is newly focused at a position spaced by an increment "+N" from the first-established focus position. Then, the focus signal F is detected again and the polarity thereof is discriminated again (Steps 102 and 103). These operations are repeated while repeatedly defining a focus position displaced toward the object 9 by a unit increment "+N" from the "current" position, until F becomes greater than zero, i.e. F>0, which means that the annular laser beam is focused at a position located at a side of the object 9 remote from the condensing lens 8. When F>0 is discriminatd, then the sequence proceeds to Step 105 at which the output signal "D1" of the inner ring sensor D1 is stored into a memory of the processing unit.

Subsequently, the annular laser beam is focused again at the position spaced by a decrement "−N" from the last-defined focus position at which "F>0" has been established. Namely, the laser beam is focused at a position nearer, by a distance N, to the condensing lens 8 than the last-established focus position. This means that the laser beam is focused again at the position which is located at a side of the object 9 facing the condensing lens 8 and which is closest to the object 9. Then, the output signal "D′2" of the outer ring sensor D2 is stored into the memory of the processing unit (Step 107).

Next, the stored output signals "D′1" and "D′2" are compared with each other (Step 108). If D1≦D′2, the current focus position at which F<0 is determined as the optimum focus position defining an optimum detection range and the position of the object 9 is detected on the basis of the current focus position and of the focus signal F which is now calculated from the output signals "D′1" and "D′2" (Step 109). On the basis of the thus detected position of the object 9, the distance to the object 9 from a predetermined reference position is detectable.

If D1>D′2, on the other hand, the focus position is again changed so that the annular laser beam is focused at a position spaced by an increment "+N" from the current focus position at which F<0 (Step 110). Then, the newly established focus position is determined as the optimum focus position having an optimum detection range, and the position of the object 9 is detected on the basis of the "currently established" focus position and of the focus signal F which is now calculated from the output signals "D1" and "D2" (Step 111). Also, on the basis of the thus detected position of the object, the distance to the object from the predetermined reference position is detectable.

Figure 4:
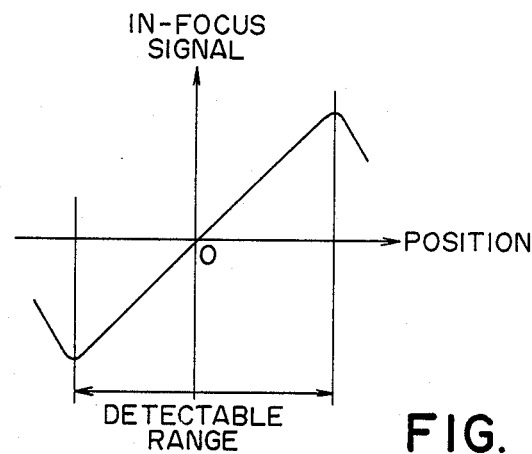
FIG. 4 is a graph showing the relation between a focus signal and the position of an object being examined.

It will be understood that the comparison of the output signals "D′1" and "D′2" at step 108 is performed so as to discriminate the optimum focus position, i.e. to discriminate which one of the two focus positions located on the both sides of the object is closer to the object and thus which one of the two detection ranges defined by the two focus positions includes the object (see FIGS. 4 and 8).

Figure 10:
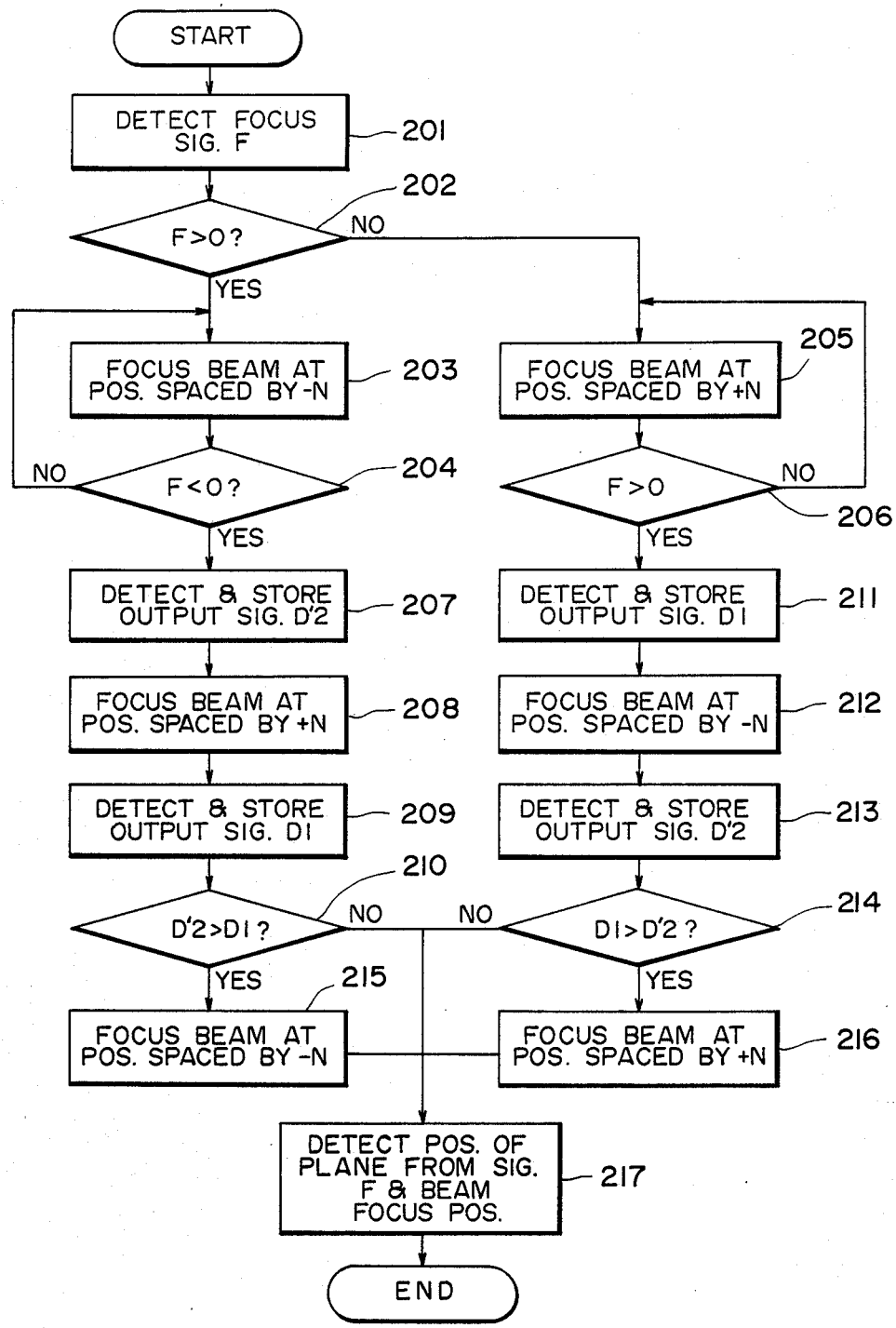
FIG. 10 is a flow chart showing a modified form of the automatic distance detection of FIG. 9.

FIG. 10 is flow chart showing a modified form of position detecting operation according to the present invention.

First, at Step 201, the annular laser beam is focused at an arbitrary position and the focus signal F is detected on the basis of the output signals of the inner and outer ring sensors D1 and D2. Then, at Step 202, the polarity of the focus signal F is discriminated to detect whether the current focus position of the annular laser beam is located at a side of the object, being examined, facing the condensing lens 8 or at a side of the object remote from the condensing lens 8. If F>0, the focus position of the annular laser beam is located at the side of the object, being examined, remote from the condensing lens 8, so the focus position controlling means is operated to change the focus position toward the condensing lens 8 by a decrement "−N" from the current position (Step 203). Then, the polarity of the focus signal F is discriminated at Step 204. If still F>0, displacement of the focus position by a unit decrement "−N" is repeated. These operations at Steps 203 and 204 are repeated until the focus signal F becomes smaller than zero. When the focus signal F becomes smaller than zero, the sequence proceeds to Step 207 and the output signal "D′2" produced by the outer ring sensor D2, when F<0 is satisfied, is stored into the memory. Subsequently, at Step 208, the focus position controlling means is operated to focus the laser beam again at the position spaced by a unit distance "+N" from the current position where F<0. Thereafter, the output signals "D1" produced by the inner ring sensor D1 corresponding to the newly established focus position at which F>0 is stored into the memory of the processing unit (Step 209). Then, the stored output signals "D′2" and "D1" are compared with each other (Step 210). If D1≧D′2, the current focus position is determined as the optimum focus position and, on the basis of this focus position and the focus signal F, the position of the object is detected. Also, on the basis of the thus detected position of the object, the distance to the object from a predetermined reference position is detectable.

If D′2>D1, on the other hand, the focus position controlling means is operated again so as to focus the annular laser beam at the position spaced by a distance "−N" from the current position where F<0 (Step 215). Then, the focus signal F corresponding to the newly established focus position is detected and, on the basis of the "current" focus position and of the focus signal F, the position of the surface of the object is detected (Step 217). Also, on the basis of the thus detected position of the object, the distance to the object from the predetermined reference position is detectable.

If the result of discrimination at Step 202 shows that the polarity of the focus signal F just after initiation of the operation of the device is F<0, the focus position at that time of the annular laser beam is located at the side of the object facing the condensing lens 8. So, the focus position is changed in a direction away from the condensing lens 8 by an increment "+N" from the current position (Step 205). Then, the polarity of the focus signal F corresponding to the newly established focus position is dicriminated at Step 206. If F<0, the sequence returns to Step 205. The operations at Steps 205 and 206 are repeated while repeatedly defining a focus position displaced toward the object, to be examined, by a unit increment "+N" from the "current" position.

When the focus signal F becomes greater than zero, the output signal "D1" of the inner ring sensor D1 is stored into the memory of the processing unit (Step 211). Subsequently, the annular beam is focused again at the position spaced by a distance "−N" from the current position where F>0 (Step 212), add the output signal "D′2" of the outer ring sensor D2 corresponding to the newly defined focus position is stored into the memory (Step 213). Then, the output signals "D1" and "D′2" are compared with each other at Step 214. If D′2≧D1, the current focus position is determined as the optimum focus position and, on the basis of the current focus position and of the focus signal F, the position of the object is detected (Step 217). Also, on the basis of the thus detected position of the object, the distance to the object from the predetermined reference position is detectable.

If D1>D′2, on the other hand, the focus position controlling means is operated again so as to focus the annular beam again at the position spaced by a distance "+N" from the current position (Step 216). Then, the position of the object is detected on the basis of the newly defined focus position and of the focus signal F corresponding to this focus position (Step 217). Also, on the basis of the thus detected position of the object, the distance to the object from the predetermined reference position is detectable.

When, during operation, the focus signal F becomes equal to zero, it means that the focus position of the annular beam is coincident with the position of the surface of the object. Therefore, the position of the object is just detected.

If the detection ranges corresponding to the sequentially defined focus positions spaced by the unit distance N overlap one upon another, and when the surface of the object to be examined is located in one of such overlap portions, either of the focus signals F corresponding to the two focus positions having partially overlapping detection ranges may be used for the sake of detection of the position of the object.

The above-described detecting operation is automatically controlled by a microcomputer contained in the processing unit 11 shown in FIG. 1. Accordingly, high-speed processing and thus high-speed detection are attainable. While, in the foregoing two examples, two focus positions which are closest to the surface of the object, to be examined, are first detected and, on the basis of the result of comparison of the output signals "D1" and "D22" of the ring sensors, the optimum focus position is determined. And, thereafter, the position of the surface of the object is detected from the focus signal F. However, this is not limitative. It is a possible alternative to store all the focus signals F corresponding to all the focus positions or to store all the detected values corresponding to all the focus positions. After the optimum focus position is discriminated, one of the stored focus signals F or detected values corresponding to the optimum focus position may be accessed.

While in the foregoing examples, the optimum focus position is determined on the basis of the change in the polarity of the focus signal F, this is not limitative. For example, it is possible to detect the optimum focus position on the basis of the phenomenon that the intensity of light as detectable on the focus state detecting means becomes maximum when the focus position is moved to a position closest to the object, being examined, the details of which will be described later. As a further alternative, the above-described two focus positions located at the opposite sides of the object and in close proximity thereto are first detected on the basis of the change in the polarity of the focus signal F and, thereafter, such one of the two focus positions whose focus signal has a smaller absolute value is selected as the optimum focus position.

Figure 11:
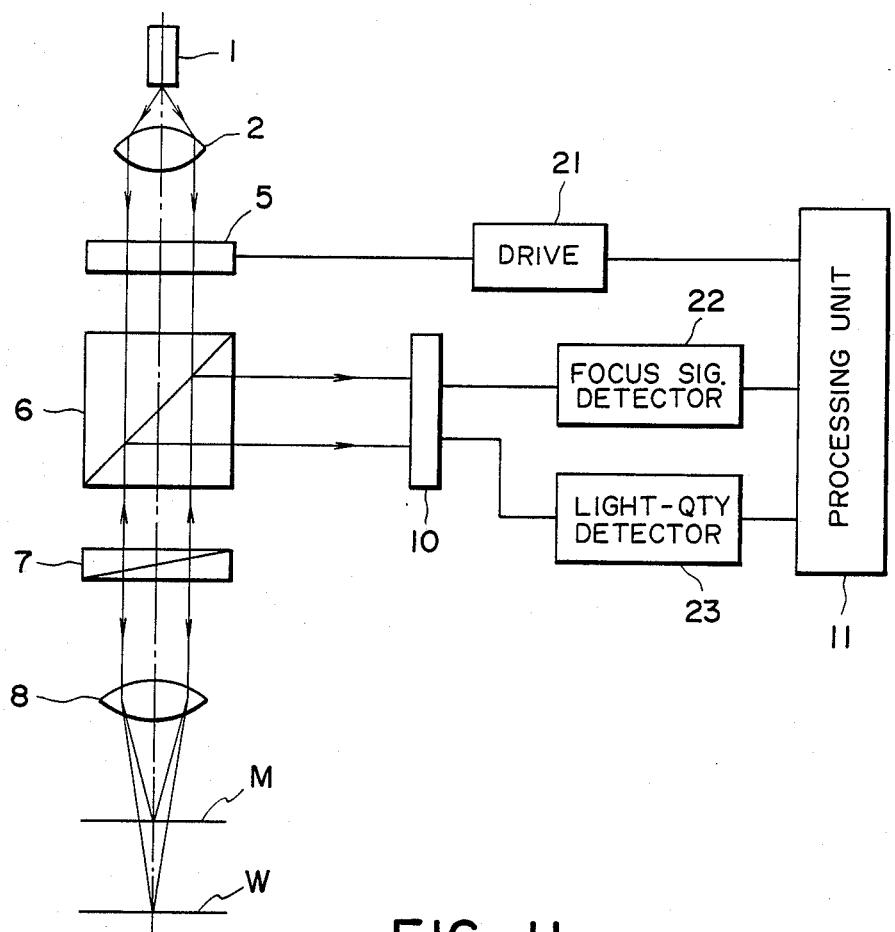
FIG. 11 is a schematic and diagrammatic view of a spacing detecting device to which a distance detecting device according to an embodiment of the present invention is incorporated.

Referring now to FIG. 11, a gap or spacing detecting device according to another aspect of the present invention will be described. Since the device of FIG. 11 includes elements similar to those of the FIG. 1 arrangement, description of like elements will be omitted here only for the sake of simplicity of explanation, by assigning the same reference numerals to corresponding elements.

The device of this embodiment is adapted to detect the gap or spacing between the surface positions of two objects such as a mask M and a wafer W usable for the manufacture of semiconductor devices, such as integrated circuits. Denoted in this Figure by numeral 21 is a driving circuit for driving the focus position controlling means 5; by 22, a focus signal detecting unit; and by 23, a light-quantity detecting unit. The driving circuit 21, the focus state detecting unit 22 and the light-quantity detecting unit 23 are connected to the processing unit 11.

In operation, according to the principle of position detection described in the foregoing, the positions of the first object M and the second object W are detected by determining optimum focus positions relative to the first and second objects, respectively, and by detecting focus signals F related to the positions of these objects, respectively. From the thus detected positions of the first and second objects M and W, the gap or spacing therebetween is detected.

As has been described with reference to FIG. 4, a satisfactory linearity between the position of an object, to be detected, and the focus signal is assured only within a limited detection range. It is therefore difficult to detect the positions of two objects spaced from each other by a substantial distance, only with a single detection range which is very narrow. In view of this, control signals are supplied from the processing unit 11 to the driving circuit 21 to actuate the focus position controlling mmeans 5, so as to change the focus position of the laser beam to thereby define optimum detection range relative to the first and second objects M and W, respectively.

The gap detecting operation will now be described in more detail. First, the processing unit 11 supplies a control signal to the driving circuit 21 so as to cause the focus position controlling means 5 to define a focus position closest to the condensing lens 8. Subsequently, additional control signals are supplied from the processing unit 11 to the driving circuit 21, whereby the focus position controlling means 5 is operated to gradually displace the focus position in a direction away from the condensing lens 8. By this, plural detectable ranges, forming one continuous detectable range, are sequentially defined such as shown in FIG. 5. When an annular laser beam described with reference t FIG. 1 is used as the detection beam and where an annular sensor such as shown in FIG. 3 is used as the focus state detecting means 10, the optical system of the FIG. 11 device is arranged such that, if the annular laser beam is exactly focused on the surface of an object, to be examined, the annular laser beam reflected by the surface of the object to the polarization beam splitter 6 is incident just on the whole surface of the annular sensor 17 including the inner an outer ring sensor D1 and D2.

Figure 12:
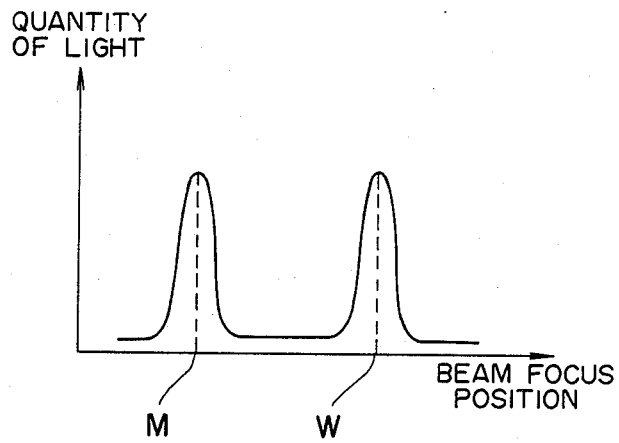
FIG. 12 is a graph schematically showing the relation between the position of focus of a beam used for the detection and the quantity of light received by focus state detecting means employed in the spacing detecting device of FIG. 11.

When, during operation, the laser beam is focused at a position closest to the first object M, the intensity of the light reflected from the first object M and received by the focus state detecting means 10 becomes maximum (except for the case where the focus position is coincident with the position of the first object M, i.e. F=0), such as shown in FIG. 12. The quantity of light received by the focus state detecting means 10 is continuously monitored by the light-quantity detecting unit 23. So, on the basis of the state of focus detected with reference to a particular focus point defined when the peak light-quantity is detected by the quantity detecting unit 23, the position of the first object M is detected from the focus signal outputted by the focus signal detecting unit 22. Subsequently, the focus position of the laser beam is further displaced in a direction away from the condensing lens 8. When it is focused at a position closest to the second object W, the quantity of light received by the focus state detecting means 10 becomes maximum as in the case of detection of the position of the first object M, so the position of the second object W is detected on the basis of the focus signal obtained at that time. By comparing the thus detected positions of the first and second objects M and W, the spacing between these objects can be detected.

As for the detection beam, a spot-like beam may of course be used as described hereinbefore. Use of annular laser beam is, however, preferable in a case where the spacing between two objects is to be detected (as in the present case), in respect to the detection accuracy. The detection of position and spacing in this embodiment is performed in accordance with a program preset in the processing unit, as in the foregoing embodiments.

Figure 9:
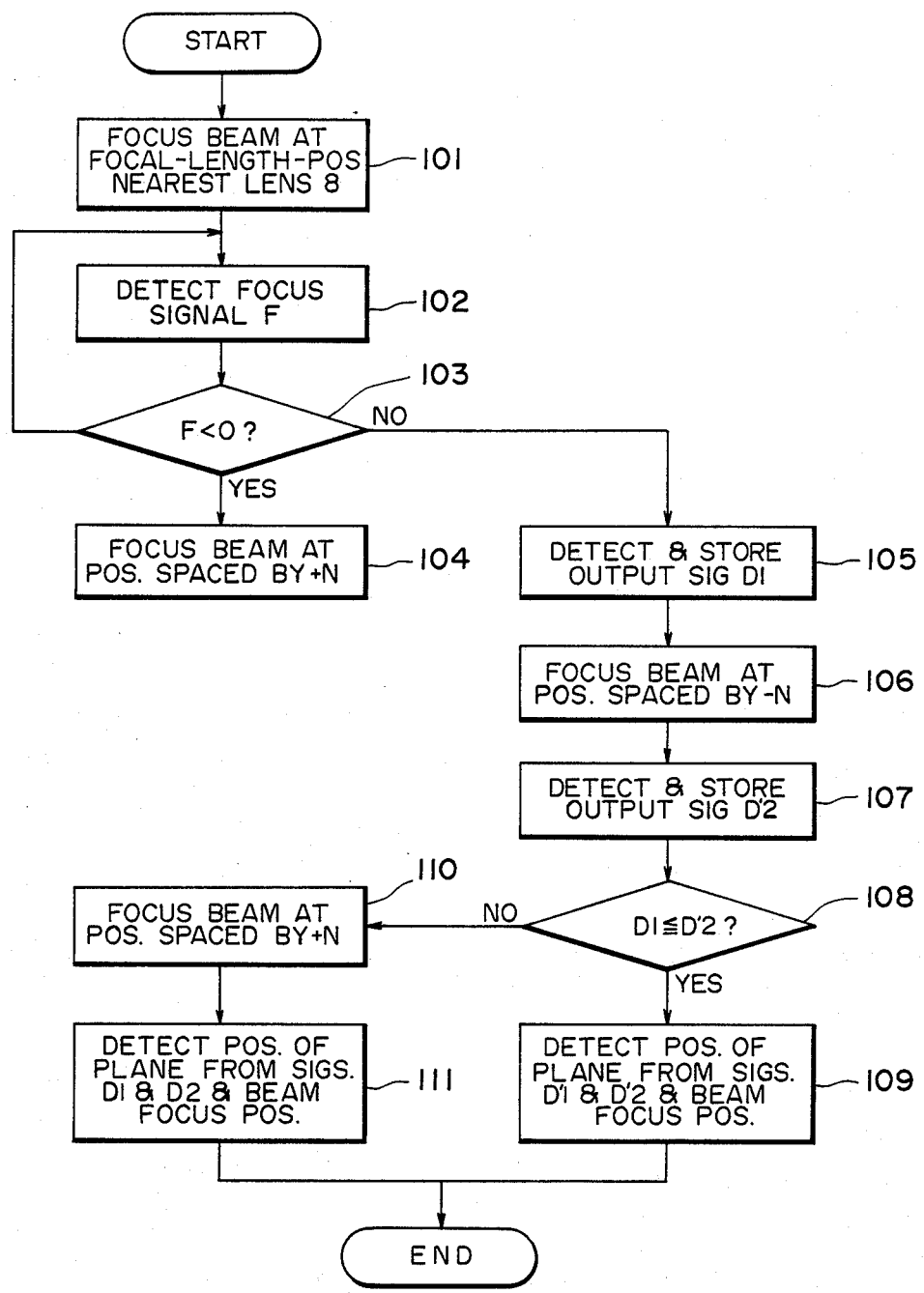
FIG. 9 is a flow chart of the automatic distance detection of the example of FIG. 8.

The process of position detection in this embodiment is not limited to the disclosed form, and those described with reference to FIGS. 9 and 10 are usable.

Figure 13:
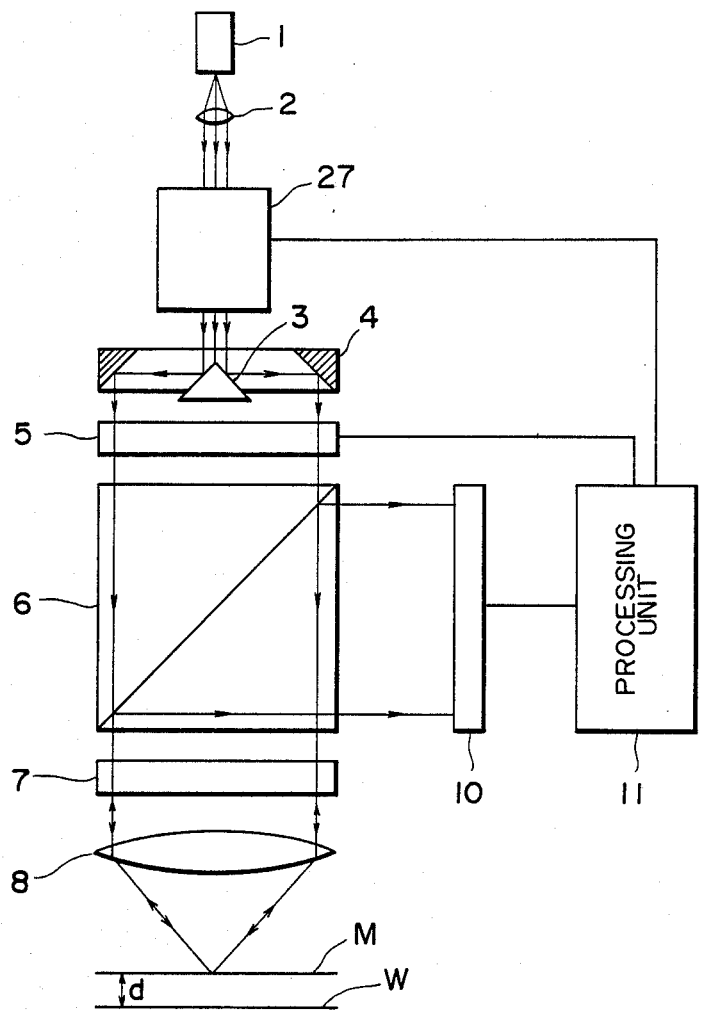
FIG. 13 is a schematic and diagrammatic view of a spacing detecting device according to another embodiment of the present invention.

FIG. 13 shows a spacing detecting device according to another embodiment of the present invention. Since, the device of this embodiment includes elements similar to those of the FIG. 1 embodiment, description of like elements will be omitted here only for the sake of simplicity of explanation, by assigning the same reference numerals to corresponding elements.

Figure 14:
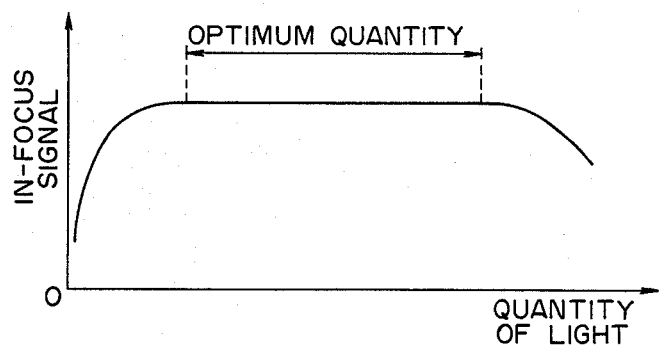
FIG. 14 is a graph showing the relation between a focus signal and the quantity of light received by focus state detecting means.

In a case where the spacing between the surfaces of two objects having significantly different reflection factors is to be detected, such as in the case of a mask and a wafer, it is possible that the quantity of light to be received by the focus state detecting means 10 changes extraordinarily due to the difference in the reflection factor. If this occurs, then accurate detection is difficult to achieve. Usually, the range of optimum quantity to which a photodetector shows satisfactory sensitivity is limited, such as shown in FIG. 14. If the quantity of light is less than the lower limit of the optimum range, the magnitude of the dark current cannot be neglected. If, on the other hand, the quantity of light is higher than the upper limit of the optimum range, the photodetector is saturated. In any case, correct detection is not ensured.

According to this embodiment of the present invention, the device includes a light-quantity controlling means 27 which is provided to adjust the quantity of light to be received by the focus state detecting means 10, so that, during the detecting operation, a quantity of light within the optimum range is stably received by the focus state detecting means 10. This assures further improvements in the detection accuracy. As for the light-quantity controlling means 27, an electro-optic device comprising an electro-optic crystal such as PLZT or the like, an ND filter device, a liquid crystal device, etc. may be used.

Figure 15:
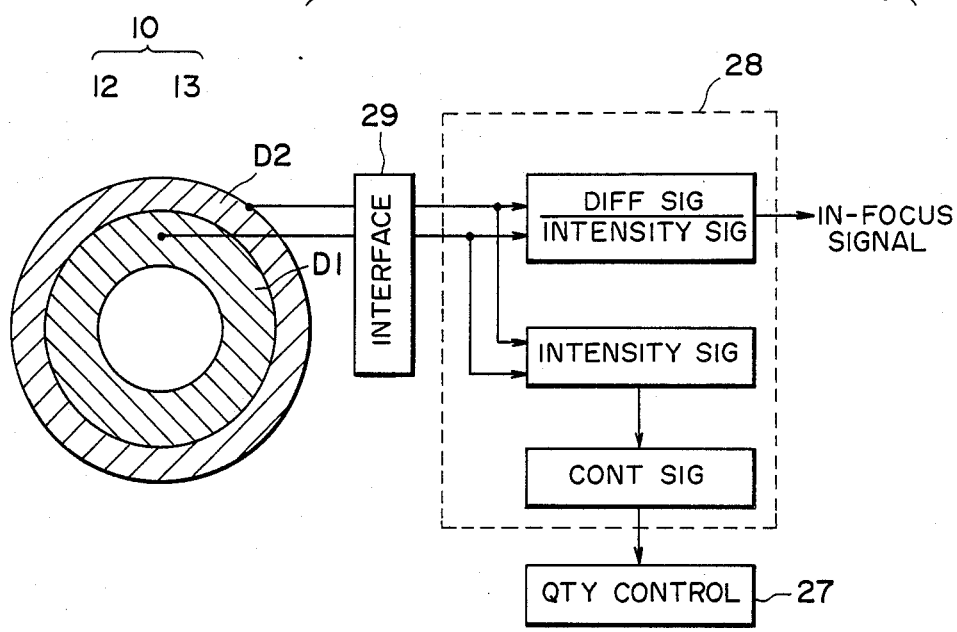
FIG. 15 is a schematic and diagrammatic view of a light quantity controlling system employed in a distance detecting device according to an embodiment of the present invention.

The manner of control of the quantity of light in the spacing detecting device according to this embodiment of the present invention will now be described in more detail with reference to FIG. 15.

Denoted in this Figure by numeral 27 is the light-quantity controlling means; by 28, a microcomputer; by 29, an interface for applying output signals of the focus state detecting means 10 to the microcomputer 28; and by references D1 and D2, inner and outer ring sensors such as shown in FIG. 3.

When the annular laser beam reflected from the surface of an object, to be examined, is incident on the surface of the photodetector 10, the output signals "D1" and "D2" of the inner and outer ring sensors D1 and D2 produced in accordance with the position of incidence of the annular laser beam on the photodetector 10 are applied via the interface 29 to the microcomputer 28.

These output signals "D1" and "D2" are processed in the microcomputer 28, such that the differential signal "D1−D2" is standardized by the intensity signal "D1+D2", whereby a focus signal is obtained. On the other hand, with regard to the intensity signal "D1+D2", whether or not the intensity is within the range of the optimum light-quantity for the photosensors 10 is discriminated. If the level of the intensity signal "D1+D2" is lower than the lower limit of the optimum range, the microcomputer 28 supplies an instruction signal to the light-quantity controlling means 27 to increase the quantity of light to be applied to the surface of the object being examined. If, on the other hand, the level of the intensity signal "D1+D2" is higher than the upper limit of the optimum range, the microcomputer 28 supplies an instruction signal to the light-quantity controlling means 27 to decrease the quantity of light to be applied to the surface of the object. When the level of the intensity signal "D1+D2" is within the optimum range, any specific control is not effected. The above-described operations are performed in accordance with a program which is preset in the microcomputer 28.

As for the controlling operation to increase or decrease the quantity of light to be received by the focus state detecting means 10, it is possible that control or instruction signals are sequentially applied to the light-quantity controlling means 27 so as to gradually change the quantity of light from the initial state to the optimum level, while repeatedly effecting the discrimination of the appropriateness of the level of the intensity. It is a possible alternative that the difference between the detected intensity signal "D1+D2" and the upper or lower limits of the optimum range is first calculated and, on the basis of the result of calculation, a control or instruction signal is applied to the light-quantity controlling means 27 so that a level within the optimum quantity is assured.

Figure 16:
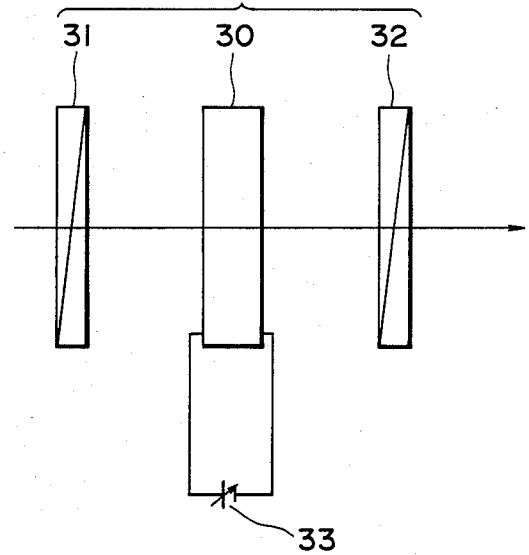
FIG. 16 is a schematic view showing a light quantity controlling portion of the system of FIG. 15.

An example of the light-quantity controlling means is shown in FIG. 16. Denoted in this Figure by numeral 30 is an electro-optic crystal such as $KH_2PO_4$ or the like; by 31, a polarizer; by 32, an analyzer and by 33, a driver for applying an electric field to the electro-optic crystal 30. The electro-optic crystal 30 is adapted to change its characteristic of double refraction in response to the application of an electric field, the amount of change (the amount of change in phase) depending on the intensity of the electric field.

Thus, in accordance with a control signal supplied from the microcomputer 28, the driver 33 is actuated to apply a predetermined magnitude of electric field to the electro-optic crystal 30, whereby the quantity of light passing through the light-quantity controlling means 27 is adjusted.

While, in the foregoing embodiment, the light-quantity controlling means has been described and illustrated as being disposed between the collimator lens 2 and the conical mirror 3, it may be placed at any position before the photosensor. Also, in place of the disclosed light-quantity controlling means, the output of the laser source may be controlled.

The position detection and the spacing detection can be executed in the device of the present embodiment on the basis of the detection of focus signals, as in the case of the foregoing embodiment. Thus, high-speed and high-accuracy detection are also attainable also with the present embodiment. The device of the present embodiment is particularly effective for the position and/or pacing detection in a case where the reflection factors of the subjects of detection differ significantly or in a case where the first and second objects whose spacing is to be detected have remarkably different reflection factors. Also, the present embodiment is effective in a case where the output of the light source varies significantly.

Figure 17:
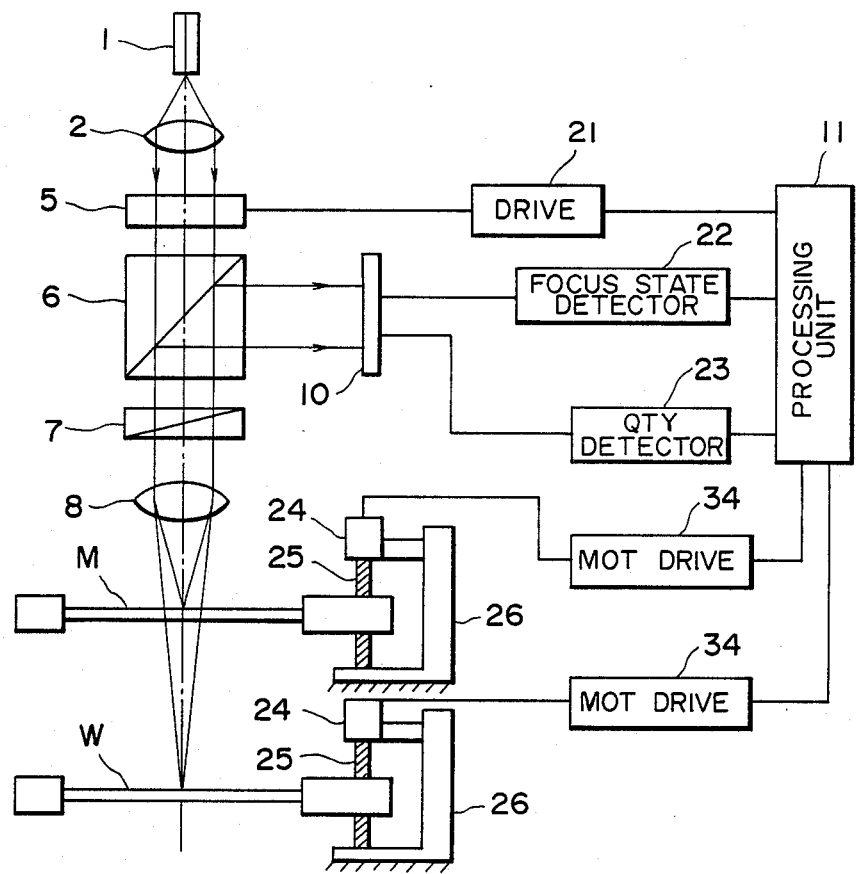
FIG. 17 is a schematic and diagrammatic view of a spacing adjusting device according to another embodiment of the present invention.

FIG. 17 shows a gap or spacing adjusting device according to a further aspect of the present invention. Since the device of the present embodiment includes elements similar to those of the FIG. 1 embodiment, description of like elements will be omitted here only for the sake of simplicity of explanation, by assigning the same reference numerals to corresponding elements.

Denoted in FIG. 17 by numerals 24 are driving motors; by 25, feed screws coupled to the driving motors 24, respectively, to be driven thereby; by 26, support bases for supporting the driving motors 24, respectively; and by 34, motor driving circuits connected to the driving motors 24, respectively.

In operation, the spacing between the positions of the surfaces of the first object M and the second object W is detected substantially in the same manner as described with reference to FIG. 11. At time, in the processing unit 1, the detected amount of spacing is compared with a predetermined spacing which should be maintained between the positions of the surfaces of the first and second objects M and W (hereinafter the predetermined spacing being referred to as "reference spacing"). That is, the processing unit 11 detects the difference between the detected spacing and the reference spacing, and also detects which one is greater. In accordance with the result of detection, the processing unit 11 supplies a control signal to one or both of the motor driving circuits 34 to actuate at least one of the driving motors 24, so that the spacing between the first and second objects M and W becomes equal to the reference spacing. By the actuation of one or both of the driving motors 24, one or both of the feed screws 25 are rotated, which causes upward and/or downward displacement of one or both the holders for the first and second objects, each having a threaded portion in engagement with corresponding feed screws 25. By this, the spacing between the first and second objects M and W is adjusted. In this manner, high-speed and high-accuracy adjustment of the spacing can be achieved.

FIG. 18 shows an inclination adjusting device according to a still further aspect of the present invention. That is, the device of the present embodiment is adapted not only to detect the spacing between two objects but also to detect the inclination of each of the two objects. Also, the adjustment of both the spacing and the inclination is attainable.

As shown in FIG. 18, the device of this embodiment includes three focus position controlling means 5a-5c, three focus state detecting means 10a-10c, a processing unit 11 connected to the focus position controlling means 5a-5c and to the focus state detecting means 10a-10c. All of these elements have substantially the same functions as of those of the corresponding elements described with reference to the foregoing embodiments. The device FIG. 18 further includes a table 35 in which three sets of driving means, each similar to that shown in FIG. 17, for adjusting, at three points, the spacing between the first object M and the second object W, are accommodated.

In operation of the device of this embodiment, the surface position of each of the first and second objects M and W is detected, with respect to three points thereon, by the three sets of the position detecting systems (5a, 10a; 5b, 10b; 10a, 10c), respectively. The positional information on each of the surfaces of the first and second objects M and W, with respect to the three points thereon, is processed by the processing unit 11, and appropriate control signals are supplied from the processing unit 11 to the three sets of driving means (not shown in FIG. 18) for displacing the second object W or moving the table 35 carrying the second object W. By the three-point detection relative to the surface of each of the first and second objects, any inclination of each of these objects are well as the spacing therebetween are detected. Also, the inclination and the spacing can be adjusted on the basis of the result of detection.

An example of the driving means for changing the spacing and/or the inclination is shown in FIG. 19A. Denoted in this Figure by numeral 24 is a driving motor; by 25, a feed screw; by 36, a support having a threaded portion for supporting the second member W or the table 35 and having a threaded portion. Actually, as described, the device of FIG. 18 has three sets of such driving means shown in FIG. 19A. In response to the control signal supplied from the processing unit 11, the driving motor 24 drives to rotate the feed screw 25, which causes upward or downward displacement of the support 36, without rotating it. By the displacement of the support 36, the portion of the second object W (or the table 35) carried by the support 36 is displaced substantially upwardly or downwardly. By effecting such position control relative to the remaining two points of the second object W, the inclination of the second object relative to the first object M as well as the spacing between the first and second objects can be adjusted. Of course, the position control may also be effected relative to the first object, as in the case of FIG. 17 embodiment.

FIG. 99B shows another example of the driving means. In this embodiment, the driving means comprises a piezoelectric actuator having a stack of piezoelectric elements. In accordance with a control signal supplied from the processing unit 11, an unshown driving means is operated to apply an electric voltage to the piezoelectric elements. By this, the piezoelectric elements are expanded or contracted, thereby to displace upwardly or downwardly the portion of the second object W (or the Table 35) carried by the piezoelectric actuator.

Figure 20:
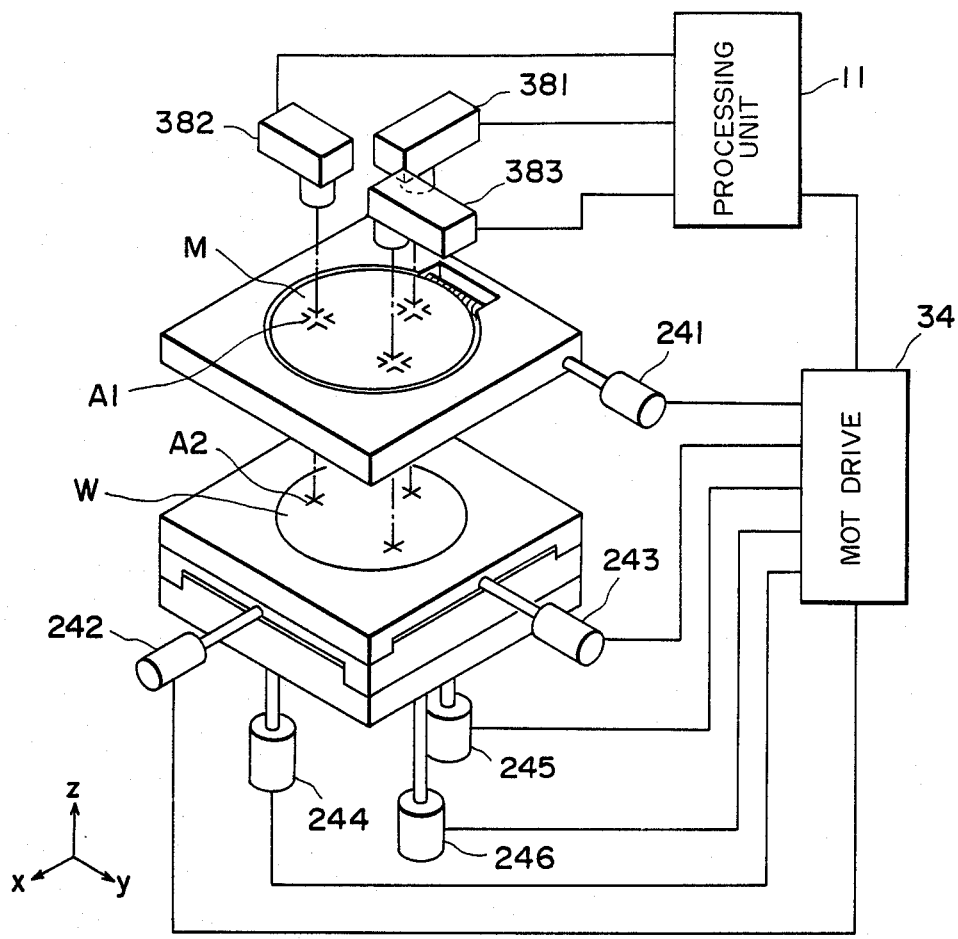
FIG. 20 is a schematic and diagrammatic view of an alignment device, according to an embodiment of the present invention, for aligning two objects three-dimensionally.
Figure 21:
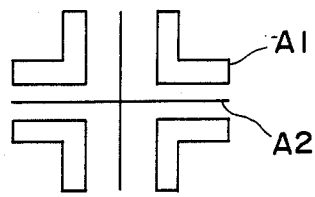
FIG. 21 is a schematic view showing the positional relation between alignment marks of the two objects, when they are aligned with each other.

FIG. 20 shows an alignment apparatus according to a still further aspect of the present invention, which apparatus is arranged to achieve alignment between two objects three-dimensionally.

The apparatus of FIG. 20 includes three position-detecting systems 381–383, a driving motor 241 adapted to rotationally move the first object M, driving motors 242 and 243 adapted to displace the second object W in the X and Y directions, and driving motors 244–246 which are independently operable to displace respective portions of the second object W substantially upwardly and downwardly. Denoted by references A1 are alignment marks formed on the first object M, and denoted by references A2 are alignment marks formed on the second object W. These alignment marks A1–A2 are provided for the sake of alignment of the first and second objects M and W with respect to the X, Y, $\theta$ (rotational) directions.

Each of the position detecting systems 381-383 includes an optical arrangement such as shown in FIG. 11 for detecting the position, in the Z direction, of each of the first and second objects M and W with respect to an associated one of three points on the first or second object. In this embodiment, a spot-like beam is used as for tee detection beam described with reference to the foregoing embodiments. Also, for the focus state detecting means 10 such as shown in FIG. 1, an area sensor comprising arrays of CCDs is used. For the sake of detection of the position with respect to the Z direction, the surface of the area sensor is divided to define two regions which are operable essentially in the same manner as the two ring sensors D1 and D2 such as shown in FIG. 3. That is, on the basis of the outputs of the two regions on the area sensor, a focus signal is obtained, as in the foregoing embodiments.

In addition thereto, each of the position detecting systems 381-383 includes an imaging optical system for forming an image of corresponding alignment marks of each of the first and second objects M and W. This imaging optical system is provided to detect the position, at an associated one of the three points, of each of the first and second objects M and W with respect to the X and Y directions. More particularly, in the X-Y position detecting operation, the associated one of the alignment marks is first irradiated with the spot-like laser beam supplied by the laser source 1 (such as shown in FIG. 11) whose diameter is adjusted by the focus position controlling means 5 so as to assure illumination of the whole area of the alignment mark. Then, the laser beam reflected from the surface of the object is picked up by the imaging optical system, whereby the image of the alignment mark is formed on the area sensor. Since the X and Y alignment is effected after the positioning in the Z direction is completed, a sharp image of the alignment mark is formed on the area sensor. In this manner, the images of alignment marks A1 and A2 corresponding to one of the three points are formed on the same area sensor.

Then, by detecting the positions of these alignment marks with respect to the X and Y coordinates defined in the area sensor, the X and Y position of each of the first and second objects, at one of the three points, can be detected.

In this manner, the position detection with respect to the X and Y directions are effected at each of the remaining two points, whereby relative position of one of the first and second objects relative to the other in the X, Y and $\theta$ (rotational) direction is detected.

The positioning of the two objects M and W in the Z direction is effected in the following manner:

First, control signals are supplied from the processing unit 11 to the motor driving circuit 34 to cause the driving motors 244-246 to rotate by predetermined amounts, respectively, in accordance with the detected positional information in the Z direction at the three points. By this, a table carrying thereon the second object W is moved in the Z direction and/or is moved inclined so that a predetermined distance is established between the entire area of the first object M and the entire area of the second object W. Subsequently, on the basis of the detected positional information with respect to the X, Y and $\theta$ directions, control signals are supplied from the processing unit 11 to the motor driving circuit 34 so as to drive the driving motors 241-243 by predetermined amounts, respectively, whereby the first and second objects M and W are brought into alignment with each other with respect to these directions. By this, the three dimensional alignment between the first and second objects M and W is completed.

In accordance with the present invention, as has been described in the foregoing, a significantly expanded detectable range is assured while still maintaining high-speed and high-accuracy detection. Further, not only the detection of position and distance but also the detection and adjustment of the gap or spacing are attainable. Moreover, three-dimensional alignment of two objects is possible according to the present invention. Therefore, the present invention is effectively applicable to a semiconductor device manufacturing alignment and exposure apparatus, as well as a gap adjusting device.

While the invention has been described with reference to the structures disclosed herein, it is not confined to the details set forth and this application is intended to cover such modifications or changes as may come within the purposes of the improvements or the scope of the following claims.

What is claimed is:

1. A position detecting device for detecting the position of an object, said device comprising:
    means for producing light;
    optical means for directing the light toward the object and for focusing the light at a position, said optical means having an optical axis;
    position detecting means, having a position detectable range, for receiving the light reflected from the object and for detecting the position, in the direction of the optical axis of said optical means, of the object with respect to the focus position of the light; and
    control means, operable to act on said optical means, for changing the focus position of the light to thereby shift the position detectable range of said position detecting means.

2. A device according to claim 1 wherein, when the object is positioned within the position detectable range of said position detecting means set with respect to a particular focus position of the light, said position detecting means produces an output signal which is proportional to the position of the object in the direction of the optical axis of said optical means.

3. A device according to claim 2, wherein said control means includes means for discriminating whether the object is positioned within the position detectable range of said position detecting means set with respect to a particular focus position of the light.

4. A device according to claim 3, wherein said discriminating means is operable to execute the discrimination in accordance with the detection by said position detecting means.

5. A device according to claim 1, wherein said optical means includes a variable-focus lens system and wherein said control means is operable to act on said lens system to change the focus position of the light.

6. A device according to claim 1, further comprising means for controlling the intensity of the light to be focused, in accordance with a reflection factor of the object.

7. A device for measuring an interval between a first object and a second object, said device comprising:
    means for producing light;
    optical means for directing the light toward the first and second objects and for focusing the light at a position;

control means operable to act on said optical means to change the focus position of the light;

position detecting means for receiving the light reflected from the first object and the light reflected from the second object and for detecting the positions of the first and second objects, respectively, wherein said control means is operable to act on said optical means so that the light from said light producing means is focused at a position near the first object when the position of the first object is going to be detected by said position detecting means and wherein said control means is operable to act on said optical means so that the light from said light producing means is focused at a position near the second object when the position of the second object is going to be detected by said position detecting means; and interval detecting means for detecting the interval between the first and second objects on the basis of the detection of the positions of the first and second objects by said position detecting means.

8. A device according to claim 7, wherein said optical means includes a variable-focus lens system and wherein said control means is operable to act on said lens system so as to the change the focus position of the light.

9. A device according to claim 7, wherein said light producing means produces light having a ring-like shape in cross-section.

10. A device according to claim 7, wherein said control means is operable to change the focus position of the light so that said position detecting means produces output signals which are proportional to the positions of the first and second objects, respectively.

11. A device for adjusting the position of an object, said device comprising:

means for producing light;

optical means for directing the light toward the object and for focusing the light at a position, said optical means having an optical axis;

position detecting means, having a position detectable range, for receiving the light reflected from the object and for detecting the position, in the direction of the optical axis of said optical means, of the object with respect to the focus position of the light;

control means, operable to act on said optical means, for changing the focus position of the light to thereby shift the position detectable range of said position detecting means; and adjusting means for displacing the object in the direction of the optical axis of said optical means in accordance with the detection by said position detecting means, to adjust the position of the object.

12. A device according to claim 11, wherein said light producing means produces light having a ring-like shape in cross-section.

13. A device according to claim 12 for use with a mask and a wafer, with the wafer being the object whose position is to be adjusted, wherein the light produced by said light producing means and having the ring-like sectional shape is projected upon the wafer by way of the mask.

14. A device according to claim 1, wherein said control means is operable to act on said optical means so that the light from said optical means is focused selectively at one of first and second positions, spaced by a predetermined distance from each other, such that said position detecting means can detect the position of the object on the basis of the selected one of the first and second positions.

15. A device according to claim 11, wherein said control means is operable to act on said optical means so that the light from said optical means is focused selectively at one of first and second positions, spaced by a predetermined distance from each other, such that said position detecting means can detect the position of the object on the basis of the selected one of the first and second positions.

16. A position detecting device for detecting the position of an object, said device comprising:

a light source;

an optical system, having an optical axis, for illuminating the object with light from said light source, said optical system focusing the light at a focus position;

position detecting means having a predetermined position-detectable range about the focus position of the light, said position detecting means receiving light reflected from the object being illuminated by said optical system to detect the position, in the direction of the optical axis of said optical system, of the object within said position-detectable range and with respect to the focus position of the light; and controlling means operable to shift the focus position of the light so that the light is focused selectively at one of plural discrete positions along the optical axis of said optical system, said plural discrete positions being predetermined so that, with respect to each position, said position detecting means has a corresponding position-detectable range which is substantially contiguous with a position-detectable range that said position detecting means has with respect to an adjacent one of said plural discrete positions;

wherein said position detecting means executes the position detection when the object is located within a position detectable range of said position detecting means, being shifted with the change in the focus position.

17. A semiconductor device manufacturing apparatus having a function for adjusting a gap between a mask and a wafer, said apparatus comprising:

a light source;

an optical arrangement for illuminating the mask and the wafer with light from said light source and for focusing the light at a point, said optical arrangement having an optical axis;

position detecting means having a predetermined position-detectable range about a position at which the light from said light source is focused by said optical arrangement, said position detecting means being operable to receive light from at least one of the mask and the wafer illuminated by said optical arrangement to detect the position of at least one of the mask and the wafer with respect to the focus position in the direction of the optical axis of said optical arrangement;

control means operable to shift the focus position of the light selectively to a plurality of predetermined discrete positions arrayed along the optical axis of said optical arrangement, so that at least one of the mask and the wafer is brought into a position-detectable range of said position detecting means defined with respect to the selected focus position; and adjusting means for adjusting the gap between the mask and the wafer on the basis of the detection by said position detecting means.

* * * * *

UNITED STATES PATENT AND TRADEMARK OFFICE
CERTIFICATE OF CORRECTION

PATENT NO. : 4,830,498

DATED : May 16, 1989

INVENTOR(S) : YOSHIFUMI NISHIMOTO ET AL.   Page 1 of 2

It is certified that error appears in the above-identified patent and that said Letters Patent is hereby corrected as shown below:

COLUMN 4

Line 23, "optically" should read --optical--.
Line 55, "it" should read --its--.

COLUMN 5

Line 31, "electrooptic" should read --electro-optic--.
Line 41, "means" should read --means.--.

COLUMN 6

Line 8, "Therefore" should read --Therefore,--.

COLUMN 7

Line 21, "in usual" should read --usually--.

COLUMN 9

Line 44, "wit" should read --with--.

COLUMN 13

Line 28, ""D1" and "D22"" should read --"D1" and "D2"--.

COLUMN 14

Line 23, "mmeans 5," should read --means 5,--.
Line 39, "reference t" should read --reference to--.
Line 48, "an" should read --and--.

UNITED STATES PATENT AND TRADEMARK OFFICE
CERTIFICATE OF CORRECTION

PATENT NO. : 4,830,498
DATED : May 16, 1989
INVENTOR(S) : YOSHIFUMI NISHIMOTO ET AL.    Page 2 of 2

It is certified that error appears in the above-identified patent and that said Letters Patent is hereby corrected as shown below:

COLUMN 19

Line 6, "as" should be deleted.
Line 7, "tee" should read --the--.
Line 59, "moved" should be deleted.

Signed and Sealed this

Sixteenth Day of April, 1991

Attest:

HARRY F. MANBECK, JR.

Attesting Officer

Commissioner of Patents and Trademarks